(12) United States Patent
Yano

(10) Patent No.: US 6,948,029 B2
(45) Date of Patent: Sep. 20, 2005

(54) DRAM DEVICE AND REFRESH CONTROL METHOD THEREFOR

(75) Inventor: Masatoshi Yano, Tokyo (JP)

(73) Assignee: NEC Corporation, Tokyo (JP)

( * ) Notice: Subject to any disclaimer, the term of this patent is extended or adjusted under 35 U.S.C. 154(b) by 381 days.

(21) Appl. No.: 10/214,139

(22) Filed: Aug. 8, 2002

(65) Prior Publication Data
US 2003/0033472 A1 Feb. 13, 2003

(30) Foreign Application Priority Data
Aug. 9, 2001 (JP) .................................... 2001-241627

(51) Int. Cl.$^7$ .............................................. G06F 12/16
(52) U.S. Cl. ...................... 711/106; 711/105; 711/162; 711/167; 713/323; 713/324
(58) Field of Search ................................. 711/105, 106, 711/162, 167; 713/320, 322, 323, 324

(56) References Cited

U.S. PATENT DOCUMENTS

| | | | |
|---|---|---|---|
| 5,805,910 A | * | 9/1998 | Lee et al. .................... 713/323 |
| 6,229,749 B1 | * | 5/2001 | Cowles et al. .............. 365/222 |
| 6,311,250 B1 | * | 10/2001 | Kishino ....................... 711/106 |
| 6,334,167 B1 | * | 12/2001 | Gerchman et al. .......... 711/106 |
| 6,542,959 B2 | * | 4/2003 | Tabo ........................... 711/106 |
| 6,546,472 B2 | * | 4/2003 | Atkinson et al. ........... 711/156 |

* cited by examiner

Primary Examiner—Gary Portka
(74) Attorney, Agent, or Firm—Foley & Lardner LLP

(57) ABSTRACT

A DRAM (dynamic random access memory) device has: DRAM with a self-refresh function; a DRAM controller for controlling the DRAM; a timer built in or externally connected to the DRAM controller; and CPU for controlling the whole device. In the DRAM device, the DRAM controller monitors access from the CPU to the DRAM and, when there is no access to the DRAM within the time set in the timer, the DRAM controller switches a refresh mode to the self-refresh mode.

22 Claims, 11 Drawing Sheets

DRAM DEVICE AND REFRESH CONTROL METHOD THEREFOR

FIELD OF THE INVENTION

The invention relates to a DRAM (dynamic random access memory) device and a refresh control method for said DRAM device and more particularly to a DRAM device which can perform refresh in a DRAM device having a self-refresh function without the consideration of the status of the operation of the DRAM device and, at the same time, can realize a reduction in power consumption, and a refresh control method for said DRAM device.

BACKGROUND OF THE INVENTION

In DRAM, since the capacitor of a memory cell is in a floated state, accumulated charges are gradually lost by a pn junction leak and leak of current across drain and source of a transistor in a memory cell. In order to prevent this unfavorable phenomenon, refresh operation is carried out. That is, even when there is no request for reading or writing, information is periodically read and rewritten. This DRAM is suitable for an increase in capacitance and, thus, together with CPU, has been widely used in electronic equipment (devices) such as personal computers.

Switching of the refresh mode of DRAM has hitherto been carried out in specific routine in the preparation of a software, for example, at the time of idling of the device, at the time of the operation of the suspend mode, or at the time of description using a power supply control routine or the like. A specific example thereof is that suspend or standby processing routine/resume processing routine is prepared and switching of refresh mode of DRAM is carried out within the routine. When suspend (or standby) processing routine for suppressing the power consumption is mounted in the equipment, design is carried out so that the refresh mode of DRAM is switched from auto-refresh mode to self-refresh mode within the routine.

Here the "auto-refresh mode" refers to a mode wherein, when there is no access to DRAM for a given period of time due to the occurrence of loop processing or the like, a DRAM controller carries out refresh in a predetermined refresh cycle. The "self-refresh mode" refers to a mode wherein, upon the receipt of a command, the DRAM per se carries out refresh in a long refresh cycle. In the self-refresh mode, the refresh cycle is long, and, thus, the power consumption in DRAM can be advantageously reduced.

In electronic equipment provided with CPU and a memory, however, the tendency toward the adoption of multifunction has led to enlargement of softwares which has in turn led to a demand for high-capacity memories. In PDAs (personal digital assistants) and portable telephones (cellular phones), PHS (personal handyphone systems) and the like which operate using a cell as a power supply, due to the limitation of supply of power, SRAMs (static random access memories) having low power consumption have hitherto been used although these SRAMs are expensive for use as memories.

In recent years, however, also in electronic equipment which is operated using a cell as a power supply, an increase in capacity of the memory has led to a tendency toward the use of DRAMS, which is low in cost and can realize an increase in capacity, instead of SRAMs. In this case, in personal computers and the like which are operated through an ac power supply, the contents of DRAM are if necessary stored in a hard disk, while, in portable telephones and the like, the use of DRAM instead of SRAM poses a problem of loss of data upon turn-off of the power supply, which problem does not occur in SRAM wherein data is stored even when the power is supply in turn-off state. Therefore, refresh control of DRAM is very important. Further, since many persons always carry portable telephones and the like with them, there is a demand for an increase in operation time, that is, a demand for a reduction in power consumption in a standby state with the power supply being turned on. To meet this demand, refresh control should be properly carried out while taking the status of operation of the device into consideration.

In the conventional DRAM device and refresh control method therefor, specifications of the switching control of the refresh mode are determined at the time of the preparation of a software. Therefore, when a person responsible for the preparation of the software prepares the software without properly understanding the behavior of the software on the device, for example, occurrence of interruption and the status of transition of task, a problem occurs such that, despite the fact that DRAM is operated in self-refresh mode, a software, which enables access to this DRAM, is incorporated.

Another problem is as follows. Upon switching of DRAM to self-refresh mode during the operation of DRAM in such a state that there is return address, CPU executes switching from auto-refresh to self-refresh. At that time, data on return address is lost by the self-refresh, and this makes it impossible to continue processing. In this case, storage of the return address in a different recording medium (SRAM) or the like is effective for avoiding this problem. This, however, complicates the construction and processing, leading to an increase in cost.

The adoption of multifunction in the above-described personal digital assistants, portable telephones and the like has led to an increase in size of softwares. This is making it difficult to perform switching of refresh mode while controlling the status of the hardware.

SUMMARY OF THE INVENTION

Accordingly, it is an object of the invention to provide a DRAM device and a refresh control method therefor which can perform the control of self-refresh of DRAM without the necessity of taking the status of the device and the like into consideration and can reduce power consumption.

According to the first feature of the invention, a DRAM (dynamic random access memory) device comprises: DRAM having a self-refresh function; a DRAM controller for controlling said DRAM; a timer built in or externally connected to said DRAM controller; and CPU for controlling the whole device, wherein said DRAM controller monitors access from said CPU to said DRAM and, when there is no access to said DRAM within the time set in the timer, said DRAM controller switches a refresh mode to the self-refresh mode.

According to this construction, when there is no access to DRAM within the time set in a timer, the refresh mode of DRAM is switched to self-refresh mode. In this case, DRAM is automatically switched to self-refresh mode, not only in the case of particular conditions as in the prior art technique (when the refresh mode of DRAM is switched from auto-refresh to self-refresh within the routine) but also, for example, in the case where loop processing is carried out for a long period of time in such a state that data region on DRAM is stored in cache or buffer. Therefore, in the preparation of a software, this construction can eliminate the need to take the status of access to DRAM during the operation of the device into consideration. Further, the power consumption of DRAM during no access to DRAM can be suppressed.

According to the second feature of the invention, a refresh control method for a DRAM (dynamic random access memory) device, comprises the steps of: monitoring access to DRAM; switching a refresh mode of said DRAM from an ordinary refresh mode to a self-refresh mode when there is no access to said DRAM within a predetermined period of time; and switching the self-refresh mode to the ordinary refresh mode when access to said DRAM has been detected during the operation of self-refresh.

According to this method, when no access to DRAM within a predetermined time has been detected, the refresh mode of DRAM is switched from ordinary refresh to self-refresh. When there is access to DRAM during the execution of self-refresh, the self-refresh is switched to the ordinary refresh. Therefore, the refresh control of DRAM is efficiently carried out, and a person responsible for the preparation of a software is not required to take the status of access to DRAM during the operation of the device into consideration. In addition, a reduction in power consumption can be realized.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

[First Preferred Embodiment]

Figure 1:
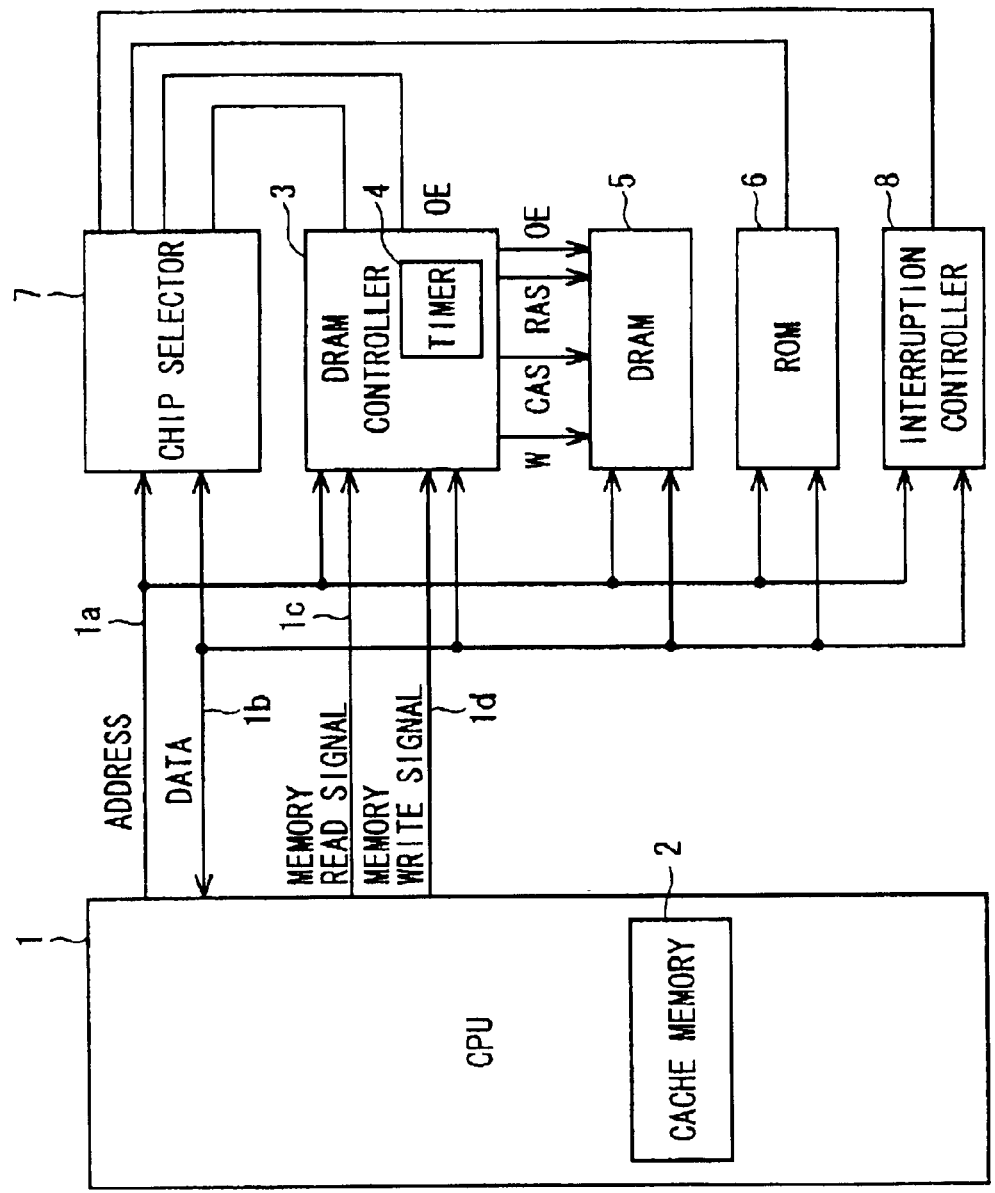
FIG. 1 is a block diagram showing a first preferred embodiment of the DRAM device according to the invention.

FIG. 1 shows a first preferred embodiment of the DRAM device according to the invention.

A DRAM controller 3, DRAM 5 with a built-in timer 4, ROM 6 for storing a program, a chip selector 7, and an interruption controller 8 are connected through an address bus 1a and a data bus 1b to CPU 1, with a built-in cache memory 2, which controls the whole device. A memory read signal 1c and a memory write signal 1d are applied at a predetermined time from CPU 1 to the DRAM controller 3. In the drawing, RAS is an abbreviation for row address strobe and is a control signal for transferring address bits for rows through the address bus 1a to DRAM 5. CAS is an abbreviation for column address strobe and is a control signal for transferring address bits for columns to DRAM 5. Further, OE represents an output enable signal.

CPU 1 executes various types of control and processing within equipment, such as a personal digital assistant or a portable telephone, according to a program stored in ROM 6. When the program stored in ROM 6 contains processing for setting of the timer 4 in the DRAM controller 3, CPU 1 sets a proper value in the timer 4. DRAM 5 is used for temporarily storing data. ROM 6 stores various programs which are executed by CPU 1. The chip selector 7 generates a chip selection signal from the address bus or the like and performs chip selection for DRAM 5. The interruption controller 8 executes interruption control upon the receipt of a request for interruption.

The DRAM controller 3 executes refresh control of DRAM 5 and the mediation and monitoring of access. Upon each access to DRAM 5, the DRAM controller 3 rewrites the value in the timer 4 to the set value (=initialization), and, when there is no access from CPU 1 to DRAM 5 within the set time, the DRAM controller 3 switches refresh mode of DRAM 5 to self-refresh mode.

The operation of the DRAM device shown in FIG. 1 will be briefly explained. The DRAM controller 3 monitors access to DRAM 5. When there is no access to DRAM 5 within a given time, for example, when loop processing is carried out for a long period of time because, in loop processing, the data region is incorporated in a cache memory or a buffer memory, the refresh mode of DRAM 5 is automatically switched to self-refresh mode. As soon as access to DRAM 5 has been detected after switching of the mode to self-refresh, the self-refresh is released, and the mode is switched to ordinary refresh mode. During this switching, the DRAM controller 3 performs control such that wait state is inserted into CPU. In the preparation of a software, this can eliminate the need to take the status of the equipment in the refresh control of DRAM 5 into consideration, and what is required of CPU 1 is only to wait. That is, the software cannot see the control of DRAM 5 (is not required to see the control of DRAM 5). This facilitates the preparation of the software. Further, since switching of the refresh mode is efficiently carried out, the power consumption can be reduced.

Figure 2:
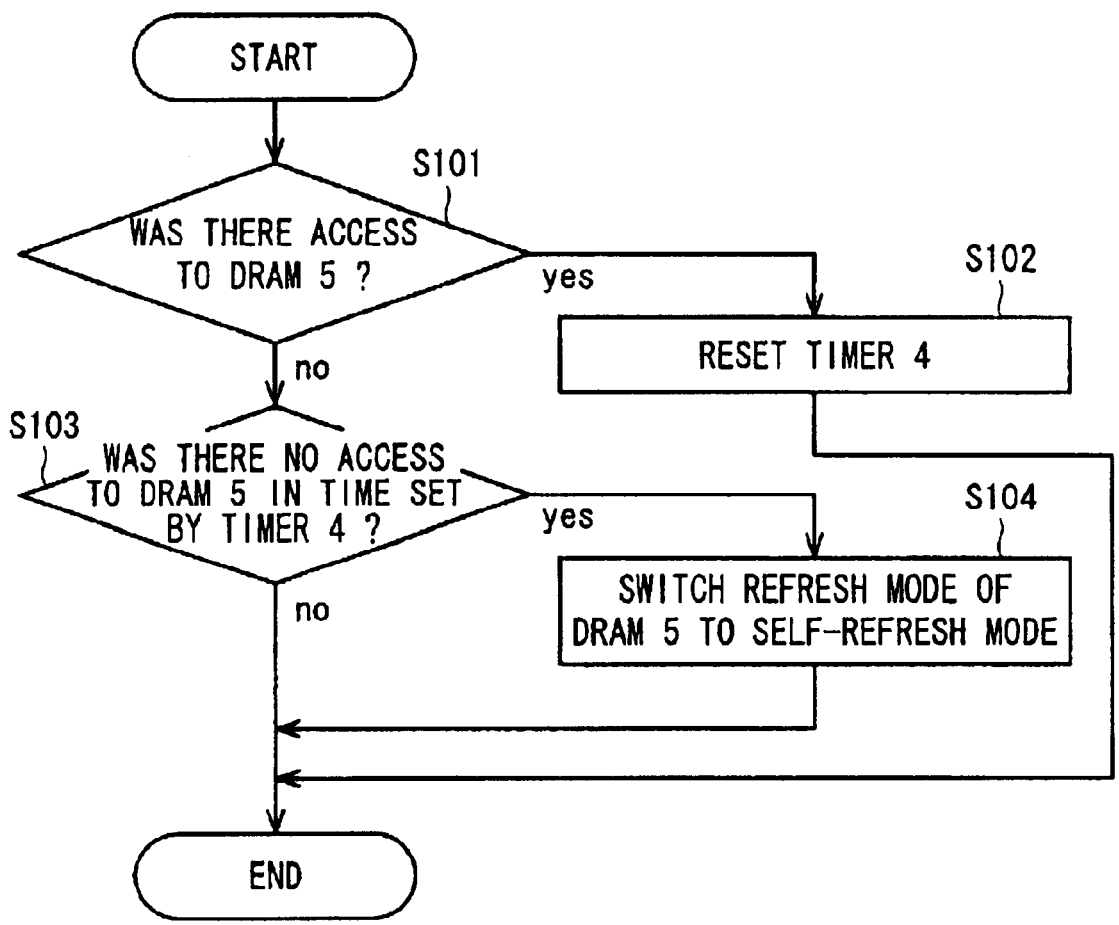
FIG. 2 is a flow chart showing self-refresh control processing of DRAM in the DRAM device shown in FIG. 1.

FIG. 2 shows self-refresh control of DRAM 5 by CPU 1 and the DRAM controller 3. In the drawing, S represents step. The operation of the invention will be explained in conjunction with FIGS. 1 and 2.

CPU 1 sets a proper value in the timer 4 within the DRAM controller 3 according to the program stored in ROM 6. The DRAM controller 3 monitors access to DRAM 5 (S101). When the access to DRAM 5 has been detected, CPU 1 rewrites the value in the timer 4 to a preset value (S102). The access to DRAM 5 is detected, for example, by a chip selection (CS) signal of the DRAM controller 3 or a read/write (R/W) control signal. Further, the DRAM controller 3 judges whether or not there is access to DRAM 5 within the time set in the timer 4 (S103). When there is no access within the time, that is, when the time set in the timer 4 is over, the DRAM controller 3 switches the refresh mode of DRAM 5 to self-refresh mode (S104).

Figure 3:
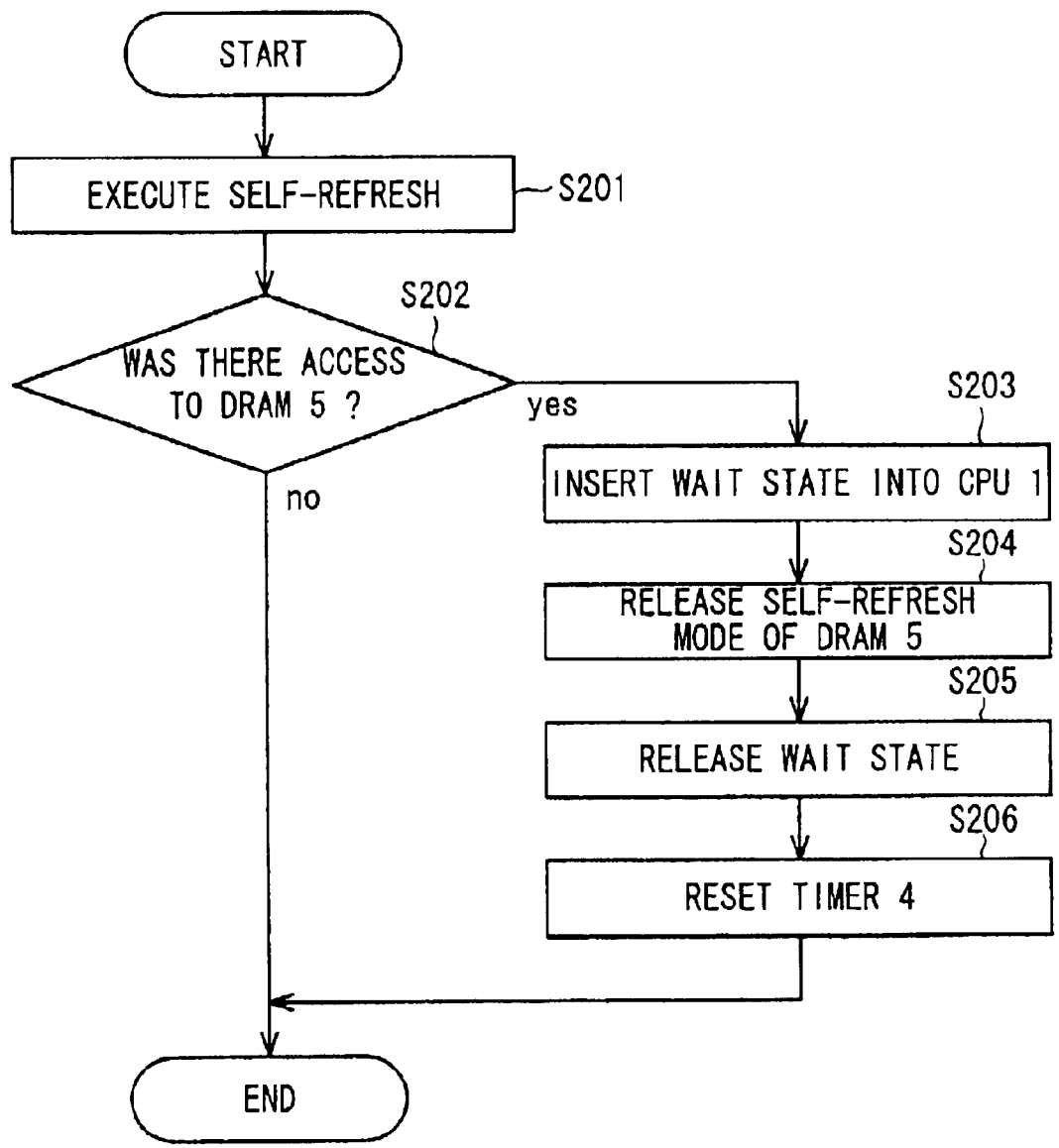
FIG. 3 is a flow chart showing processing after switching of refresh mode to self-refresh mode.

FIG. 3 shows processing after switching of refresh mode to self-refresh mode in step 104 shown in FIG. 2.

In such a state that the mode of DRAM 5 is switched to self-refresh mode (S201), upon the detection of access to DRAM 5 (S202), the DRAM controller 3 inserts wait state into CPU 1 until the completion of switching (S203), and the self-refresh mode is released, that is, the self-refresh mode is switched to ordinary refresh mode (such as auto-refresh mode) (S204). Subsequently, the wait state in CPU 1 is released (S205), and the value in the timer 4 is then reset to a value set by CPU 1 (S206) to complete the processing.

Thus, since the refresh mode of DRAM is automatically switched, in the preparation of a software, there is no need to take the status of access to DRAM during the operation of the device into consideration. Further, in the prior art technique, the self-refresh is executed only under conditions set at the time of preparation of a software by the person who has prepared the software, whereas, in the invention, the mode is automatically switched to self-refresh when there is no access to DRAM 5 within a predetermined time, contributing to reduced power consumption. For example, in SDRAM of 128 MB (for example, tradename: $\mu$PD 45128821), a current 131 mA is consumed in ordinary refresh operation, while, in self-refresh, the consumption of current is 1 to 2 mA. That is, the power consumption in self-refresh can be reduced.

[Second Preferred Embodiment]

Figure 4:
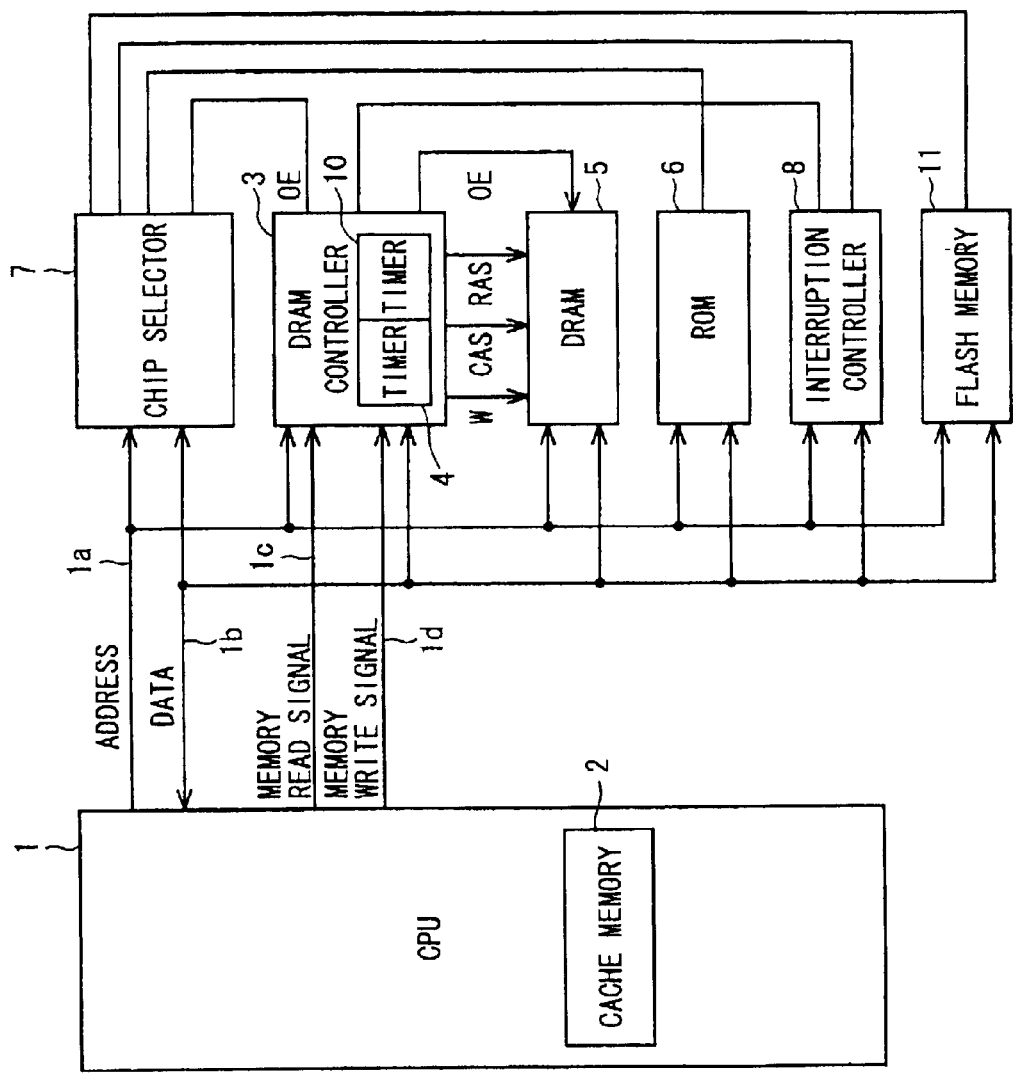
FIG. 4 is a block diagram showing a second preferred embodiment of the DRAM device according to the invention.

FIG. 4 shows a second preferred embodiment of the DRAM device according to the invention.

This preferred embodiment is characterized in that the execution of power-down mode can further suppress power consumption as compared with the above preferred embodiment. The construction of this preferred embodiment is different from that of the preferred embodiment shown in FIG. 1 in that a second timer 10 is added to the timer 4 and that a flash memory 11 is additionally provided. The timer 10 measures the time which has elapsed from the time when DRAM 5 was switched from the refresh mode to the self-refresh mode. The flash memory 11 is used for the backup of the contents of DRAM 5. The provision of the flash memory 11 can realize the storage of the contents of DRAM 5 in a different memory by the backup operation.

Figure 5:
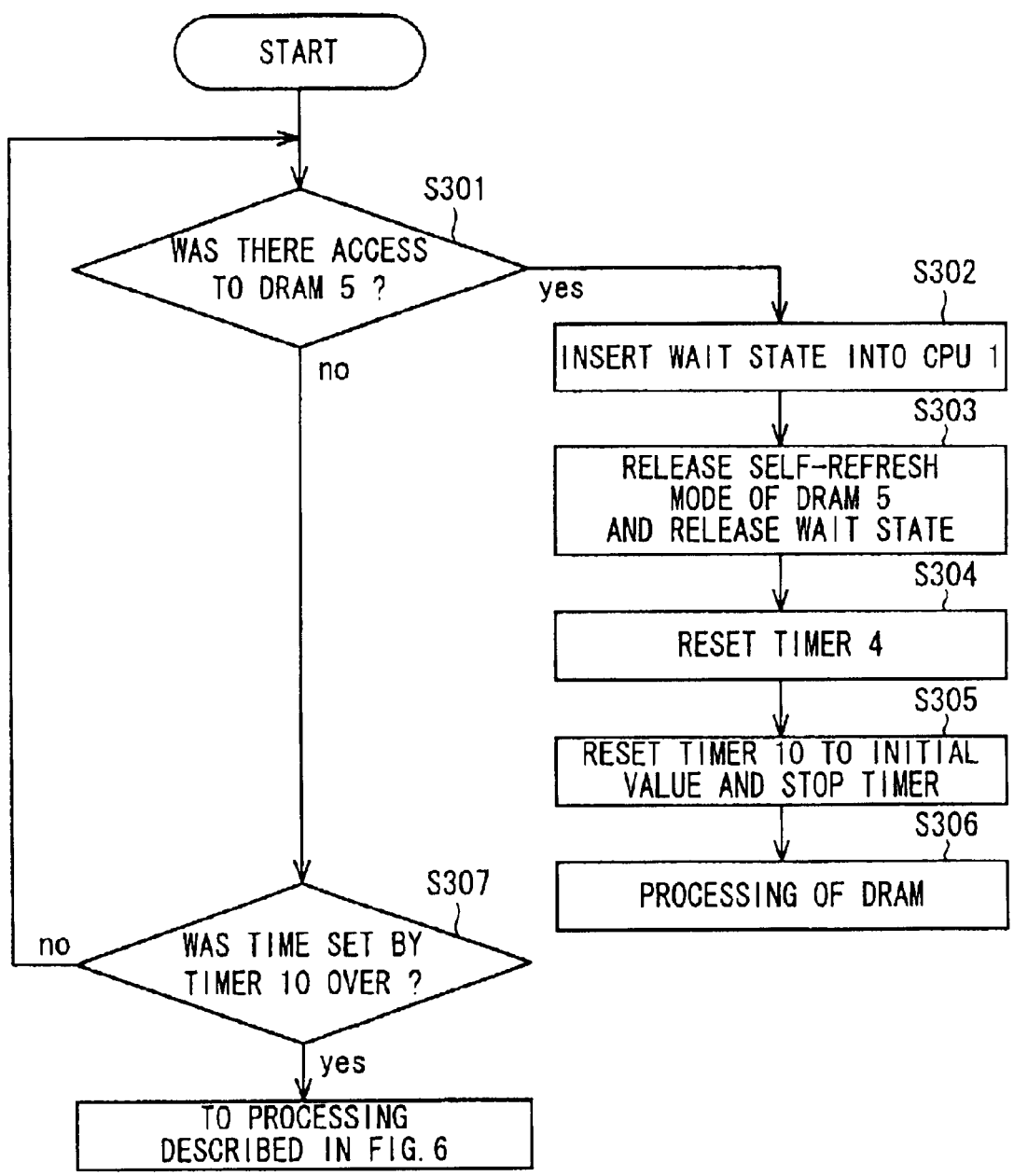
FIG. 5 is a flow chart showing processing upon switching of refresh mode to self-refresh mode in the construction shown in FIG. 4.
Figure 7:
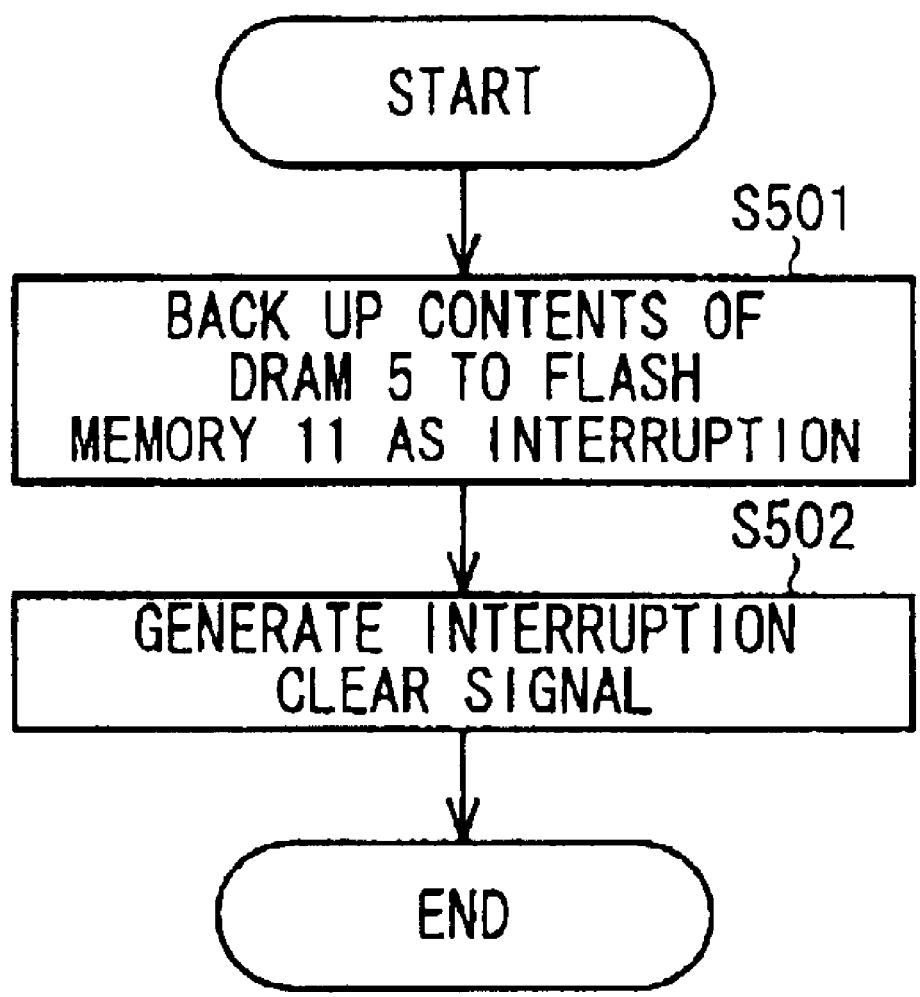
FIG. 7 is a step flow chart showing processing for a flash memory shown in FIG. 4.
Figure 8:
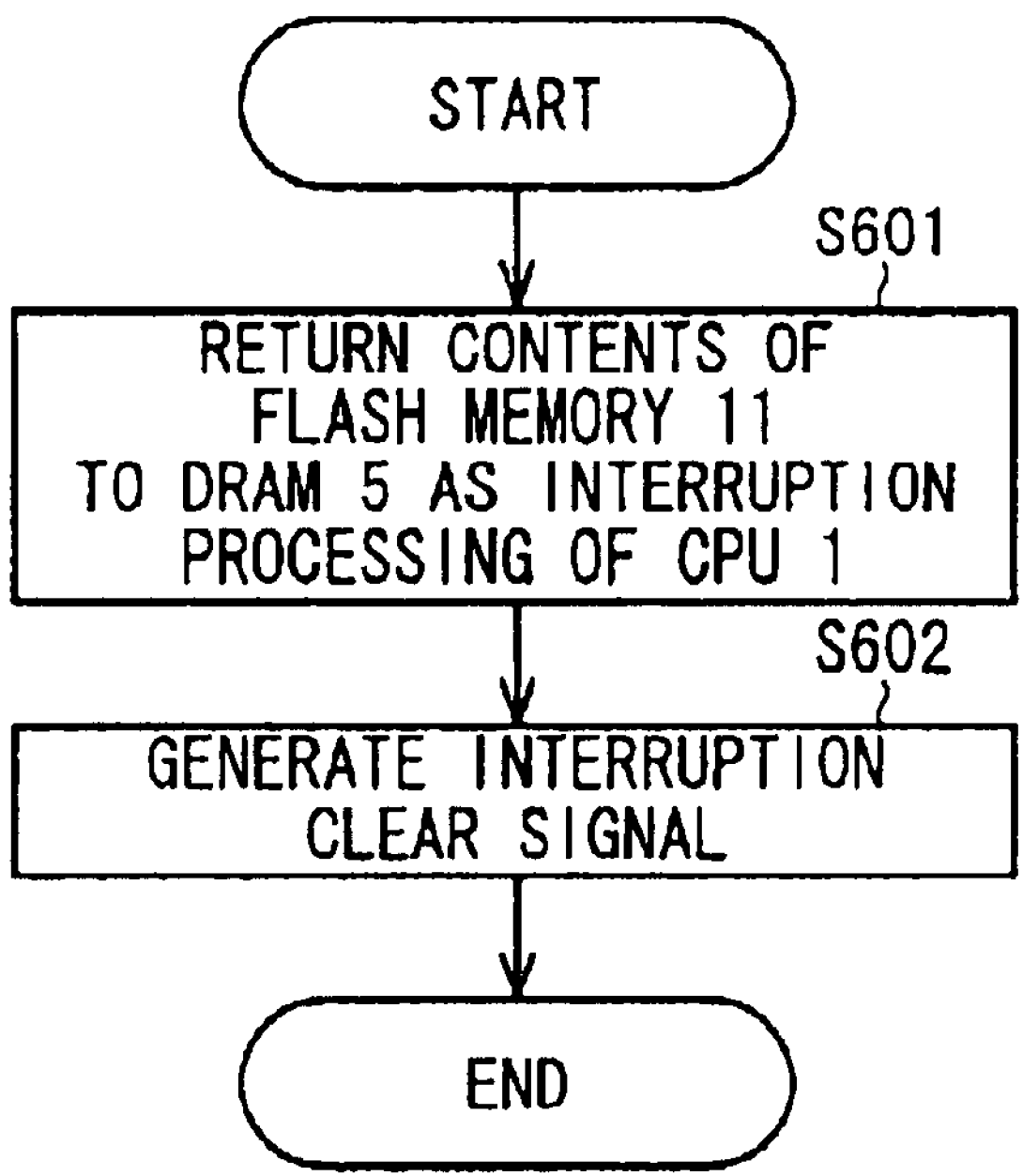
FIG. 8 is a step flow chart showing another processing for a flash memory shown in FIG. 4.
Figure 9:
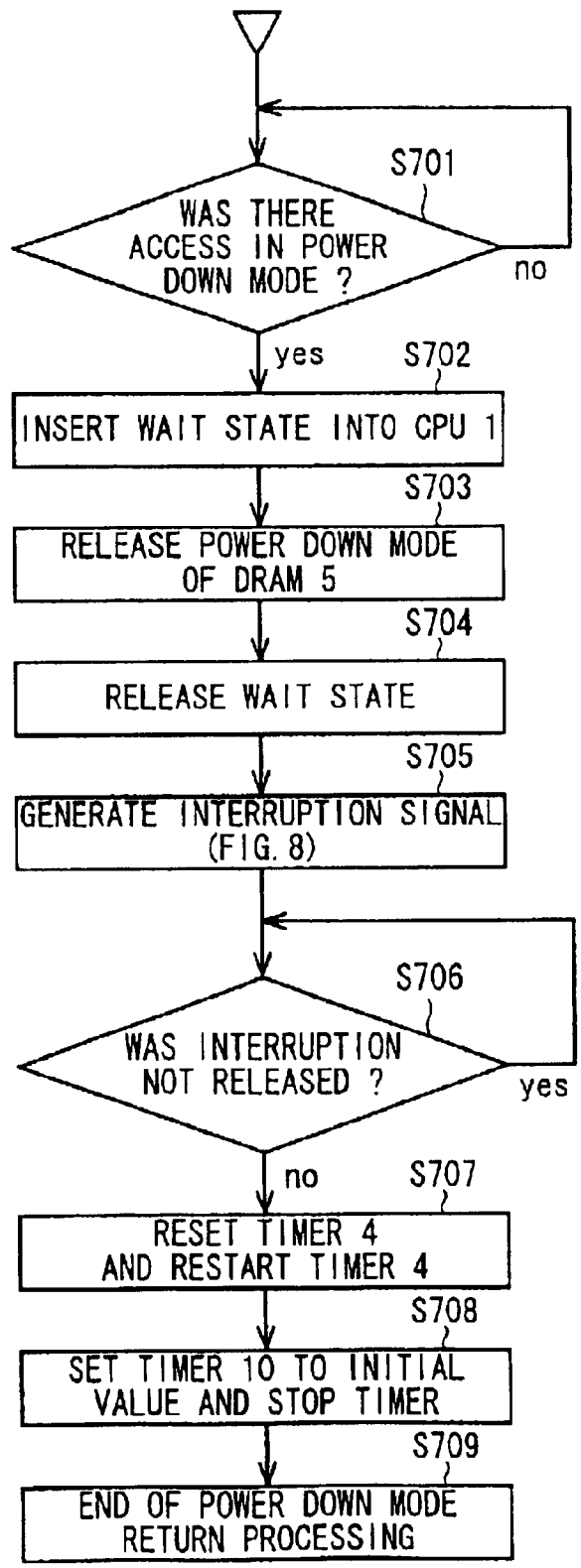
FIG. 9 is a flow chart showing processing after the insertion of wait state into CPU.

FIG. 5 shows processing upon switching of refresh mode to self-refresh mode in the construction shown in FIG. 4. FIGS. 6, 7, 8, and 9 show processing at the time of occurrence of interruption. Here FIGS. 7 and 8 show processing for the flash memory 11, and FIG. 9 shows processing after the insertion of wait state into CPU 1.

As shown in FIG. 5, in such a state that the mode of DRAM 5 is switched to self-refresh mode, upon the detection of access to DRAM 5 (S301), the DRAM controller 3 inserts wait state into CPU 1 until the completion of switching (S302), and the self-refresh mode of DRAM 5 is released, followed by the release of wait state in CPU 1 (S303). Subsequently, the value in the timer 4 is reset (S304). Thereafter, the timer 10 is reset to the initial value and is stopped (S305), and processing of DRAM is executed (S306). In S301, when the result of the judgment is that there was no access to DRAM 5, judgment is made on whether or not the time set in the timer 10 has elapsed. When the elapsed time is shorter than the set time, the processing is returned to S301, followed by re-execution of the processing. On the other hand, when the set time has elapsed, processing shown in FIG. 6 is executed (S308).

Figure 6:
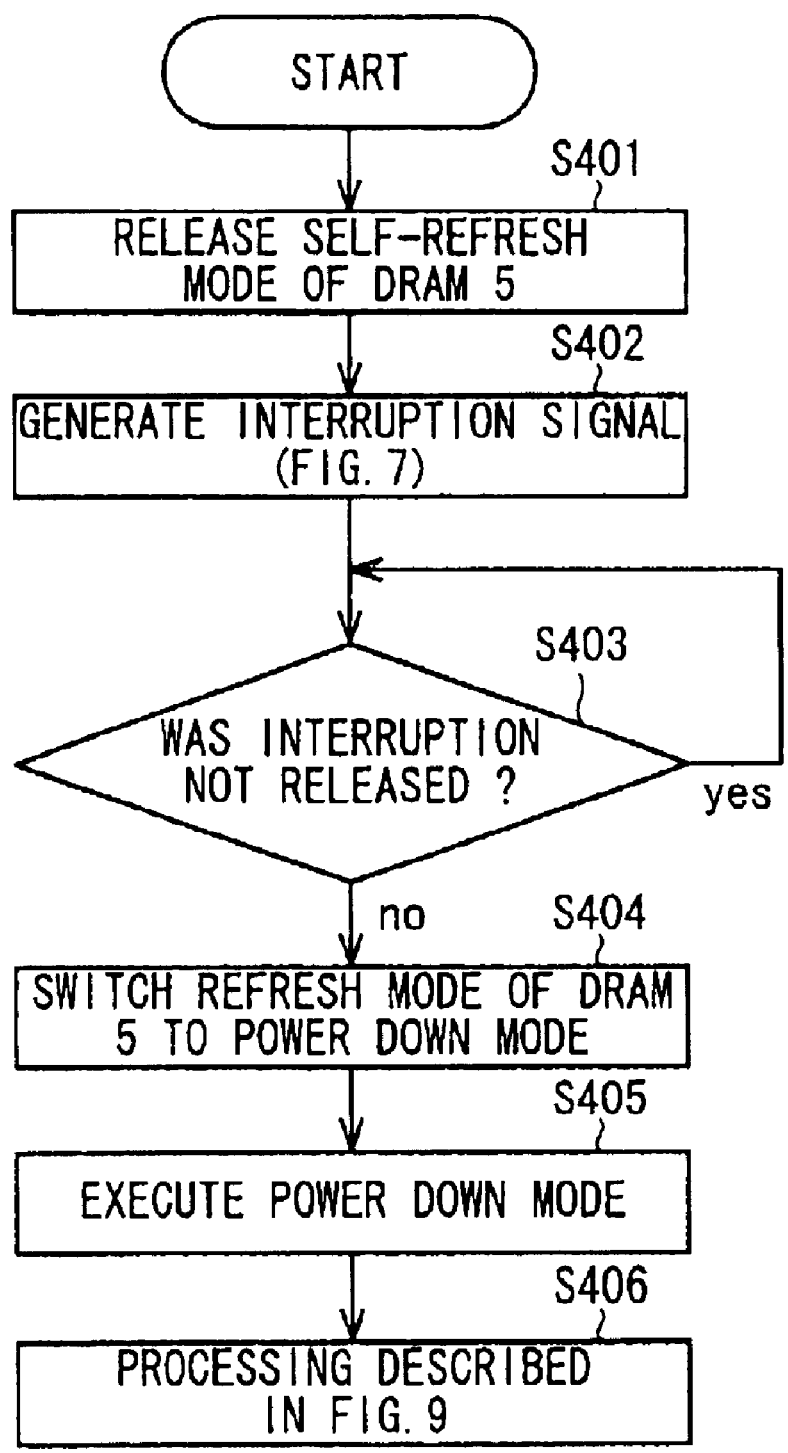
FIG. 6 is a flow chart showing processing at the time of release of refresh mode in the construction shown in FIG. 4.

As shown in FIG. 6, when the time set in the timer 10 has elapsed in the state of self-refresh, the self-refresh of DRAM 5 is released (S401 in FIG. 6). Subsequently, a request for interruption is made, and an interruption signal is notified to CPU 1 through the interruption controller 8 (S402). Upon the acceptance of interruption, CPU 1 performs the backup of the contents of DRAM 5 in the flash memory 11 (S601 in FIG. 7) and notifies the DRAM controller 3 through the interruption controller 8 of the clear of interruption (S602). Upon the receipt of information on the clear of interruption, the DRAM controller 3 switches the refresh mode of DRAM 5 to power-down mode (S404). Subsequently, as soon as the power-down mode has become active (S405), processing shown in FIG. 9 is executed (S406).

Processing shown in FIG. 6 destructs data of DRAM 5. However, as compared with the self-refresh mode, a power-down mode, which can further save power, can be set. Therefore, the suppression of power consumption can be further improved.

When access to DRAM 5 has occurred during power-down mode in S405 in FIG. 6 (S701 in FIG. 9), the DRAM controller 3 inserts wait state into CPU 1 until the completion of switching of DRAM 5 (S702). Subsequently, DRAM 5, which is in power-down mode, is returned to ordinary mode (S703). After the release of wait state in CPU 1 (S704), interruption is notified to CPU 1 through the interruption controller 8 (S705). Upon the acceptance of interruption, CPU 1 rewrites the contents of the flash memory 11 in DRAM 5 (S601 in FIG. 8) and notifies the DRAM controller 3 through the interruption controller 8 of the clear of interruption (S602). A judgment is made by the DRAM controller 3 on the release of interruption (S706). When the result of the judgment is that the interruption remains unreleased, the timer 4 is restarted (S707), and, in addition, the value in the timer 10 is rewritten (initialized). The timer 10 is stopped (S708), and the processing of the power-down mode is then completed (S709).

According to this preferred embodiment, switching to the self-refresh mode in step 104 can reduce the burden on the person responsible for the preparation of the software. Further, the suppression of current consumption can reduce power consumption. Furthermore, when the self-refresh is continued for a predetermined period of time, the self-refresh is released, interruption processing is executed and switching to power-down mode is carried out, contributing to further saving of power.

Figure 10:
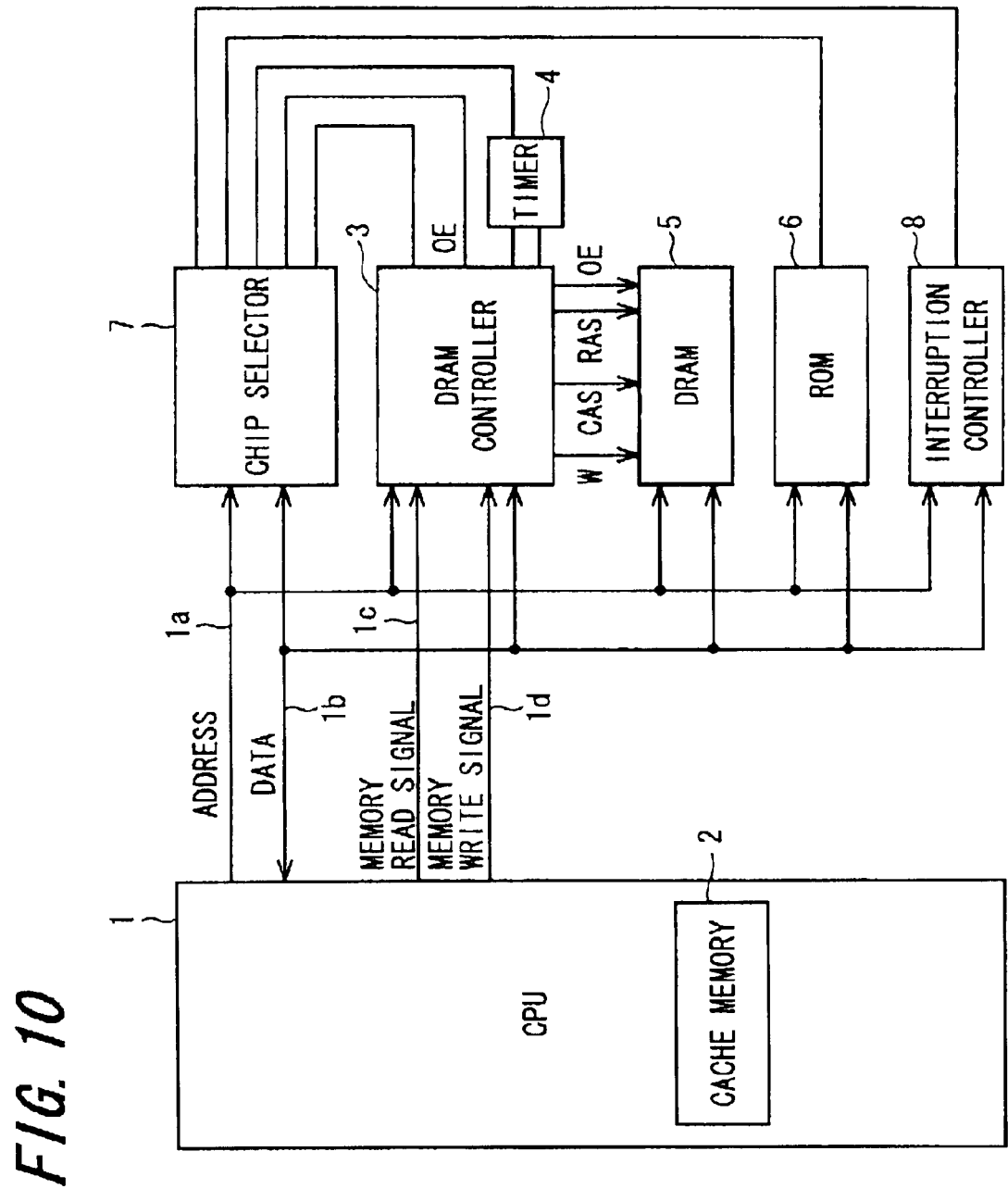
FIG. 10 is a block diagram showing a variant of the construction shown in FIG. 1.

FIG. 10 shows a variant of the construction of FIG. 1.

In the construction shown in FIG. 10, the timer 4 built in the DRAM controller 3 is taken out of the DRAM controller 3, and the timer 4 is externally mounted onto the DRAM controller 3. According to this construction, since there is no need to incorporate the timer 4 in the DRAM controller 3, the degree of freedom of IC used as the DRAM controller 3 can be increased. Further, the adoption of a combination of a general-purpose (existing) DRAM controller 3 with a general-purpose timer 4 is possible.

[Third Preferred Embodiment]

Figure 11:
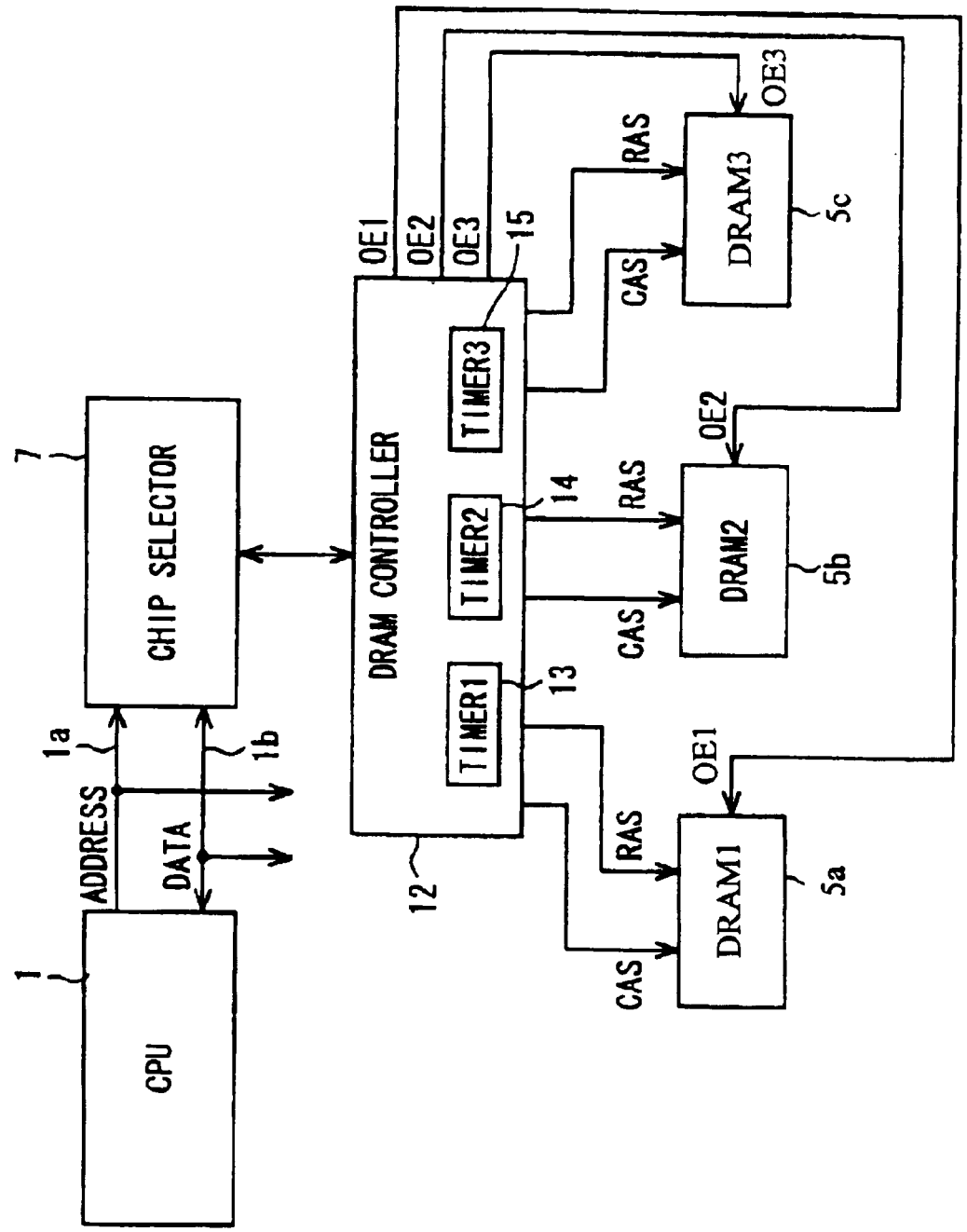
FIG. 11 is a block diagram showing a third preferred embodiment of the DRAM device according to the invention.

FIG. 11 shows a third preferred embodiment of the DRAM device according to the invention.

According to this preferred embodiment, a plurality of DRAMs can be controlled one by one by the DRAM controller. This is suitable in the case where DRAM has large capacity. For example, when 24 MB is necessary as storage capacity of the whole DRAM, according to the construction in this preferred embodiment, a DRAM controller 12 may be provided wherein DRAMs 5a, 5b, 5c, which each have a capacity of 8 MB, are used and are provided respectively with timers (1) 13, (2) 14, and (3) 15. OE signals (OE 1, OE 2, and OE 3) are sent from the DRAM controller 12 respectively to DRAMs 5a, 5b, 5c. The timers 13 to 15 may be built in the DRAM controller 12, or alternatively may be externally mounted.

The whole region of the memory is not always used, and, in general, only a relatively small memory area is used. For example, when the storage of data is carried out in the order of DRAM 5a→DRAM 5b→DRAM 5c, access to DRAM 5a frequently occurs. In this case, the priority is set to DRAM 5a (first priority)→DRAM 5b (second priority)→DRAM 5c (third priority). Further, the time in the timers is set to timer 13<timer 14<timer 15. When there is no access to DRAM 5a within the time set in the timer 13, the DRAM controller 12 switches only DRAM 5a to the self-refresh mode and changes DRAMs 5b, 5c from auto-refresh mode to self-refresh mode (or power-down mode). When there is access to DRAMs 5a and 5b while there is no access to DRAM 5c, only DRAM 5c is switched from auto-refresh mode to self-refresh mode (or power-down mode). According to this construction, even when the memory capacity is increased, refresh is effectively carried out. Alternatively, since power-down mode is carried out, the effect of suppressing the power consumption of the DRAM device improves with increasing the memory capacity.

In the above preferred embodiment, DRAM may be SDRAM. The flash memory 11 may be other memory such as static memory or ferroelectric memory (FRAM). As described above, the DRAM device according to the invention may be used in combination with CPU. Further, the DRAM device according to the invention can be applied to DSP (digital signal processor).

Further, in FIG. 1, a flash memory may be additionally provided for the backup of the contents of DRAM 5 at the time of or for turn-off of the power supply. This flash memory is connected to an address bus 1a and a data bus 1b.

As is apparent from the foregoing description, according to the DRAM device of the invention, a DRAM controller monitors access to DRAM. When there is no access within the time set in a timer, the DRAM controller switches refresh mode to self-refresh mode. Therefore, for example, when loop processing is carried out for a long period of time in such a state that data region on DRAM is stored in cache or buffer, DRAM is automatically switched to self-refresh mode. In the preparation of a software, this can eliminate the need to take the status of access to DRAM during the operation of the device into consideration. Further, the power consumption of DRAM can be suppressed.

Further, in the refresh control method for a DRAM device according to the invention, access to DRAM is monitored. When there is no access to DRAM within a predetermined period of time, the refresh mode of DRAM is switched from ordinary refresh to self-refresh. When there is access to DRAM during the execution of self-refresh, the self-refresh is switched to the ordinary refresh. According to this construction, the refresh control of DRAM is efficiently carried out, and a person responsible for the preparation of a software is not required to take the status of access to DRAM during the operation of the device into consideration. In addition, a reduction in power consumption can be realized.

The invention has been described in detail with particular reference to preferred embodiments, but it will be understood that variations and modifications can be effected within the scope of the invention as set forth in the appended claims.

What is claimed is:

1. A DRAM (dynamic random access memory) device comprising:

DRAM having a self-refresh function;

a DRAM controller for controlling said DRAM;

a timer; and a CPU;

wherein said DRAM controller monitors access from said CPU to said DRAM and, when there is no access to said DRAM within time set in the timer, said DRAM controller switches a refresh mode of said DRAM to the self-refresh mode;

wherein when a predetermined period of time has elapsed in the self-refresh mode, said DRAM controller releases the self-refresh mode and makes a request for interruption;

wherein, upon receipt of the request for interruption, said CPU makes a backup copy of the contents of said DRAM in other memory and notifies said DRAM controller of an interruption clear signal and said DRAM controller performs control so as to switch the refresh mode of said DRAM to a power-down mode; and wherein the CPU can continue to perform processing when the DRAM is in the power-down mode.

2. The DRAM device according to claim 1, wherein, in such a state that the mode is switched to self-refresh, upon the detection of access to said DRAM, said DRAM controller switches the self-refresh mode to ordinary refresh mode and, in addition, inserts wait state into said CPU until the completion of the switching.

3. The DRAM device according to claim 1, wherein said DRAM controller detects the access to said DRAM through at least one of a chip selection signal, a memory read signal, and a memory write signal.

4. The DRAM device according to claim 1, further comprising a second timer for measuring the time that has elapsed after switching to the self-refresh mode.

5. The DRAM device according to claim 1, wherein a memory having a power save mode is used in said DRAM and a power save mode is executed instead of the self-refresh mode.

6. The DRAM device according to claim 1, wherein said DRAM is used in a portable telephone (a cellular phone), PHS (personal handyphone system), or PDA (personal digital assistant) which is operated using a cell as a power supply.

7. The DRAM device according to claim 1, wherein a plurality of DRAMs of said type and a plurality of timers of said type are provided and priority of the plurality of DRAMs is set while different times are set respectively to the timers corresponding to the plurality of DRAMs.

8. A refresh control method for a DRAM (dynamic random access memory) device, comprising the steps of:

monitoring access to DRAM;

switching a refresh mode of said DRAM from an ordinary refresh mode to a self-refresh mode when there is no access to said DRAM within a predetermined period of time; and switching the self-refresh mode to the ordinary refresh mode when access to said DRAM has been detected during the operation of self-refresh;

wherein, upon the elapse of a predetermined period of time in the self-refresh mode, the self-refresh mode is released, the contents of said DRAM are stored by backup in other memory, and the mode is switched from the self-refresh mode to a power-down mode; and wherein the CPU can continue to perform processing when said DRAM is in the power-down mode.

9. The refresh control method for a DRAM device according to claim 8, wherein the detection of said access is carried out through at least one of a chip selection signal, a memory read signal, and a memory write signal.

10. The DRAM device according to claim 2, wherein said DRAM controller detects the access to said DRAM through at least one of a chip selection signal, a memory read signal, and a memory write signal.

11. The DRAM device according to claim 2, wherein said DRAM is used in a portable telephone (a cellular phone), PHS (personal handyphone system), or PDA (personal digital assistant) which is operated using a cell as a power supply.

12. The DRAM device according to claim 2, wherein a plurality of DRAMs of said type and a plurality of timers of said type are provided and priority of the plurality of DRAMs is set while different times are set respectively to the timers corresponding to the plurality of DRAMs.

13. A DRAM (dynamic random access memory) device comprising:
   a plurality of DRAMs, each DRAM of the plurality of DRAMs having a self-refresh mode;
   a DRAM controller for controlling the plurality of DRAMs;
   a plurality of timers, each tinier of the plurality of timers associated with a corresponding DRAM of the plurality of DRAMs, and each timer set with a different time depending on a priority that is assigned to the corresponding DRAM; and
   a CPU;
   wherein the DRAM controller monitors access from the CPU to the plurality of DRAMs and, when there is no access to a DRAM within a time set in a corresponding timer, the DRAM controller switches a refresh mode of the DRAM to the self-refresh mode.

14. The DRAM device according to claim 13, wherein, in such a state where a mode of a particular DRAM of the plurality of DRAMs has been switched to the self-refresh mode, upon a detection of access to said particular DRAM, said DRAM controller switches the self-refresh mode of said particular DRAM to ordinary refresh mode and, in addition, inserts a wait state into said CPU until a completion of the switching of the mode.

15. The DRAM device according to claim 13, wherein said DRAM controller detects an access to each DRAM of the plurality of DRAMs through at least one of a chip selection signal, a memory read signal, and a memory write signal.

16. The DRAM device according to claim 13,
   wherein when a particular DRAM of the plurality of DRAMs has been in the self-refresh mode for a predetermined period of time, said DRAM controller releases the self-refresh mode of said particular DRAM and makes a request for an interruption to the CPU; and
   wherein upon a receipt of the request for the interruption, said CPU makes a backup copy of the contents of said particular DRAM in other memory and notifies said DRAM controller of an interruption clear signal and performs control so as to switch the refresh mode of said particular DRAM to a power-down mode.

17. The DRAM device according to claim 13, further comprising:
   a plurality of second timers, each second timer of the plurality of second timers associated with a corresponding DRAM of the plurality of DRAMs for measuring a time which has elapsed once the corresponding DRAM has been switched to the self-refresh mode.

18. The DRAM device according to claim 13, wherein a memory having a power save mode is used in each DRAM of said plurality of DRAMs, and the power save mode is executed instead of the self-refresh mode.

19. The DRAM device according to claim 13, wherein said plurality of DRAMs are used in a portable telephone (a cellular phone), a PHS (personal handyphone system), or a PDA (personal digital assistant) which is operated using a cell as a power supply.

20. A refresh control method for a DRAM (dynamic random access memory) device, comprising the steps of:
   monitoring access to a first DRAM having a first priority for data access;
   monitoring access to a second DRAM having a second priority for data access that is less than the first priority;
   switching a mode of the first DRAM from an ordinary refresh mode to a self-refresh mode when there is no access to the first DRAM within a first predetermined period of time;
   switching a mode of the second DRAM from the ordinary refresh mode to the self-refresh mode when there is no access to the second DRAM within a second predetermined period of time that is longer than the first predetermined period of time;
   switching the mode of the first DRAM from the self-refresh mode to the ordinary refresh mode when access to the first DRAM has been detected while the first DRAM is in the self-refresh mode; and
   switching the mode of the second DRAM from the self-refresh mode to the ordinary refresh mode when access to the second DRAM has been detected while the second DRAM is in the self-refresh mode.

21. The refresh control method for a DRAM device according to claim 20, wherein the monitoring of access to the first and second DRAMs is carried out through at least one of a chip selection signal, a memory read signal, and a memory write signal.

22. The refresh control method for a DRAM device according to claim 20,
   wherein, upon the elapse of a third predetermined period of time of the first DRAM being in the self-refresh mode, the self-refresh mode of the first DRAM is released, the contents of the first DRAM are stored by backup in other memory, and the mode of the first DRAM is switched to a power-down mode; and
   wherein, upon the elapse of a fourth predetermined period of time of the second DRAM being in the self-refresh mode, the self-refresh mode of the second DRAM is released, the contents of the second DRAM are stored by backup in other memory, and the mode of the second DRAM is switched to the power-down mode.

* * * * *